United States Patent [19]

Mason

[11] 4,124,863
[45] Nov. 7, 1978

[54] POSITIVELY BIASED SUBSTRATE IC WITH THERMAL OXIDE GUARD RING

[75] Inventor: Donald R. Mason, Indialantic, Fla.

[73] Assignee: Harris Corporation, Cleveland, Ohio

[21] Appl. No.: 786,916

[22] Filed: Apr. 12, 1977

[51] Int. Cl.² ............................................. H01L 29/34
[52] U.S. Cl. .......................................... 357/54; 357/42; 357/52
[58] Field of Search .............................. 357/52, 54, 42

[56] References Cited

U.S. PATENT DOCUMENTS

| 3,226,611 | 12/1965 | Haenichen | 357/54 |
| 3,763,550 | 10/1973 | Oakes | 357/52 |
| 3,912,559 | 10/1975 | Harigaya et al. | 357/52 |
| 4,001,872 | 1/1977 | Khajezadeh | 357/54 |

Primary Examiner—Joseph E. Clawson, Jr.
Attorney, Agent, or Firm—Leitner, Palan, Martin & Bernstein

[57] ABSTRACT

A chemically vapor-deposited, phosphorus doped insulating layer is recessed from the scribe edge of a thermally grown oxide layer thereunder a sufficient distance to interrupt the current path from the negatively biased pad and aluminum interconnect to the positively biased substrate through the phosphorus doped insulating layer.

13 Claims, 3 Drawing Figures

POSITIVELY BIASED SUBSTRATE IC WITH THERMAL OXIDE GUARD RING

BACKGROUND OF THE INVENTION

The present invention relates generally to passivation layers of integrated circuits and more particularly to improved structure of passivation layers for integrated circuits having positively biased substrates and aluminum interconnects.

Integrated circuits formed in silicon substrates generally use a silicon dioxide film formed by thermal oxidation on the surface of the substrate. This silicon dioxide film is used as a mask during the formation of the integrated circuit in the silicon substrate and is also used as a passivation layer of the finally formed integrated circuit. The thermal oxidation process for forming silicon dioxide film usually results in a contaminant ion such as sodium which is mobil by the electric field. In order to minimize the effect of the sodium ion, it is well known to provide a phosphorus glass or a phosphorus doped, silicon dioxide layered on the thermally grown silicon dioxide layer. The second layer is often formed by chemical vapor deposition and the contaminant sodium ions are trapped by the chemically vapor-deposited layer.

In integrated circuits having a positively biased substrate and aluminum interconnects, corrosion of the aluminum interconnects has been observed. The factors contributing to the corrosion of interconnects are the positively biased substrates and the poor moisture resistance of the phosphorus doped passivating layer. W. M. Paulson and R. W. Kirk observed that: (a) the corrosion requires externally applied bias; (b) the corrosion occurs predominantly to the negative electrode; (c) the corrosion initiates at the interface between the aluminum and the passivation glass; and (d) the extent of the corrosion depends upon the phosphorus in the passivation glass. This analysis is provided in their article entitled "The Effects of Phosphorus-doped Passivation Glass on the Corrosion of an Aluminum" in the Proceedings of the Twelfth Annual Reliability Physics Symposium, pages 172-179, 1974.

The presence of moisture in the phosphorus doped passivation layer is a critical factor in producing the corrosion. The corrosion of the aluminum is apparently a non-electrolytic corrosion and results from the presence of hydroxyl ions at the cathode. The corrosion mechanism is discussed by E. P. G. T. Van de Ven and H. Koelmans in *J. Electrochem, Soc.* 123, pps. 143-144, (Jan. 1976); and by B. Chatterjee in *J. Electrochem, Soc.* 123, pps. 1920-1921, Dec. 1976). Hydroxyl ions may be produced at the cathode of the integrated circuit through an electrolytic mechanism or simply by dissociation by water to hydrogen and hydroxyl ions. In the presence of water in the package, the phosphorus from the phosphorus doped passivation layer or carbon dioxide present from oxidation of residual laser scribe protective coating during the high temperature sealing process on CERDIP devices increases the conductivity of the passivated layer. A surface electric field then moves the hydrogen ions through or on the conductive, phosphorus doped passivation layer where they react at the aluminum cathode at the aluminum-phosphorus doped passivation layer edge by electron transfer to generate $OH^-$ ions and $H_2$. If additional water is present, it would combine with the $OH^-$ ions to form a reaction product of $AlO_2^-$, the net reaction being $Al + 2H_2O + e^- \rightarrow AlO_2^- + 2H_2$.

Although the reaction was initiated by the original $H^+$ ions generated in or on the phosphorus doped passivation layer, the aluminum corrosion reaction proceeds as long as water vapor is present at the corroding aluminum — $AlO_2^-$ interface and $OH^-$ ions are generated by cathodic reduction of $H^+$ ions. Also, an ionic conduction path must be maintained to generate the $OH^-$ ions in the corroding region. R. B. Comizzoli discusses the current paths and conductivity of the phosphorus doped passivation layers in the March 1976 issue of the Journal of Electrochemical Society at pages 386-391. The three major conduction paths are: (a) between the two bonding pads; (b) across the P-N isolation junction; and (c) between the positively biased silicon substrate and the negative bonding pad and interconnects.

Prior efforts to reduce the corrosion problem have been directed mainly towards the elimination of water or moisture from the encapsulated integrated circuits. Since these techniques included process steps at elevated temperatures, cycling of temperatures, and the use of non-oxidizing gases, the reliability of the final product cannot be quaranteed. Thus there exists a need for a structural solution to the corrosion problem.

SUMMARY OF THE INVENTION

The present invention virtually eliminates the major conduction path between the positively biased substrate and the negative bonding pad and aluminum interconnect to reduce the corrosion of the aluminum interconnects. The conduction path is interrupted by receding the chemically vapor-deposited, phosphorus doped insulating or passivation layer from the edge of the thermally grown oxide layer by a sufficient distance to prevent conduction from the negative interconnect and bonding pad through the chemically vapor-deposited insulating layer to the positively biased substrate. A recession of at least 0.05 mils from the scribe line edge of the thermally grown oxide layer per volt of potential difference between the substrate and bonding pad is sufficient to interrupt the conduction path.

OBJECTS OF THE INVENTION

An object of the present invention is to provide a structural solution to minimizing the corrosion of amphoteric metal pads and interconnects.

Another object is to provide a solution to aluminum corrosion of pads and interconnects which increases the reliability of the product.

A further object of the invention is to interrupt the current path between the negatively biased aluminum interconnects and positively biased substrate.

Other objects, advantages and novel features of the present invention will become apparent from the following detailed desciption of the invention when considered in conjunction with the accompanying drawings.

DESCRIPTION OF THE PREFERRED EMBODIMENTS

Figure 1:
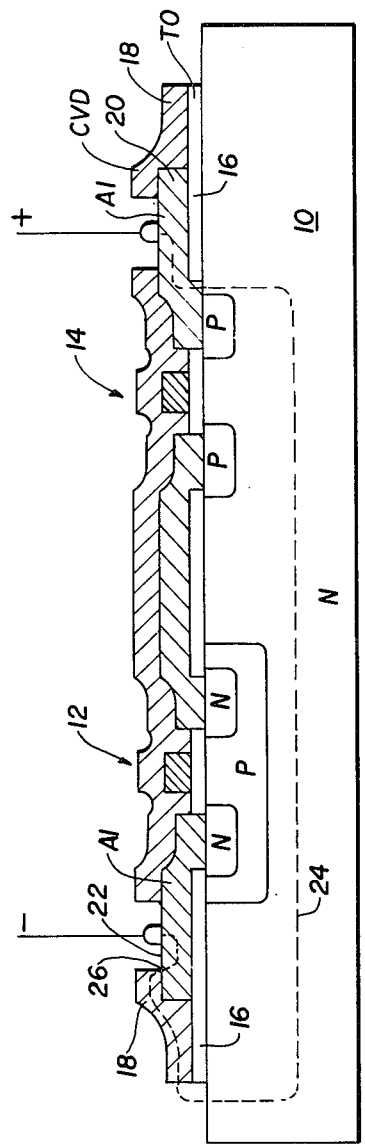
FIG. 1 is a cross sectional view of a prior art junction isolated integrated circuit having CMOS.

A CMOS type integrated circuit and the current path that the present invention is designed to eliminate are illustrated in FIG. 1. The integrated circuit includes an N-type substrate 10 having therein an N channel MOS 12 and P channel MOS 14 formed therein. The surface of the substrate and the CMOS are covered with a first insulating layer 16 being a thermally grown silicon dioxide and a chemically vapor-deposited insulating or passivating layer 18 thereon. Layer 18 is, for example, phosphorus doped silicon dioxide or may be a phosphorus glass passivating layer.

Aluminum interconnect 20 forms an interconnect and bonding pad between the positive source of potential and the substrate 10. Aluminum interconnect 22 forms a bonding pad for the negative source of potential. The undesirable current path between the positively biased substrate 10 and the negative interconnect and pad 22 through the phosphorus doped insulating layer 18 is illustrated by the dash line path 24. It should be noted that the initial reaction which is described in the prior art occurs at the edge 26 between the chemiclly vapor-deposited, phosphorus doped insulating layer 18 and the negative bonding pad and interconnect 22. As illustrated in FIG. 1, the top insulating layer 18 is coexistent at the scribe edge with the thermally grown insulating layer 16.

Figure 2:
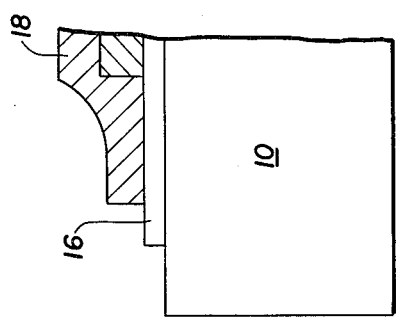
FIG. 2 is an illustration of a substrate, thermally grown insulating layer and a chemically vapor-deposited insulating layer embodying the principles of the present invention.

The present invention interrupts current path 24 by receding the lateral edge of the chemically vapor-deposited phosphorus doped insulating layer 18 from the lateral edge of the thermally grown insulating layer 16 as illustrated in FIG. 2. Recession of greater than 0.05 mils per volt of potential difference between the substrate and the negative pad is considered effective to interrupt this path. For the embodiment illustrated in FIG. 2, with layer 16 having a thickness of approximate 5,000 to 6,000 angstroms and a resistance of approximately 1 to 5 × $10^9$ ohms, a separation of 0.5 mils was sufficient to interrupt the major ionic surface conduction path generated by a 10 volt potential difference from the positively biased N substrate 10 and the negatively biased bonding pad and interconnect 22. Although the conduction paths still exist between the pads 20 and 22 through the second insulating or passivating layer 18 and cross the P-N junctions of the integrated circuits, the interruption of the negative pad to positive substrate path greatly reduces the corrosion at the negative aluminum terminal.

Figure 3:
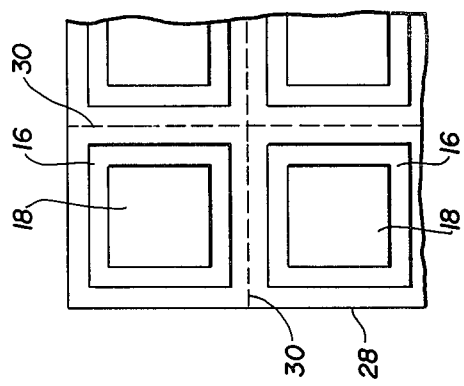
FIG. 3 is a plain view of a wafer diagrammatically illustrating the two insulating layers and their relationship to each other and the scribe line.

The structure of FIG. 2 is easily obtained as illustrated in FIG. 3, by processing a wafer 28 by well-known process steps to form integrated circuits in a plurality of chip regions. The thermally grown silicon dioxide layer 16 is formed in the process and used as a mask to form the regions of the integrated circuits. A second insulating layer 18 for passivation is formed and may be, for example, phosphorus doped siloxane formed by chemical vapor deposition. Layers 16 and 18 are formed so as to have the geometry illustrated in FIGS. 2 and 3 wherein layer 16 recedes sufficiently from the scribe lines 30 to expose the scribe lines and layer 18 recedes from the edge of layer 16 sufficiently to interrupt the undesirable current path between the positively biased substrate 10 and the negative interconnect 22. The wafer 28 is then divided along the scribe lines 30 into a plurality of chips wherein each of the chips is a junction isolated integrated circuit including, for example, CMOS devices.

From the preceding description of the preferred embodiments, it is evident that the objects of the invention are obtained in that corrosion at the negative aluminum pad and interconnect is eliminated by interrupting the major current leakage path between the negatively biased aluminum interconnect and pad and the positively biased substrate. Though the invention has been described and illustrated in detail, it is to be clearly understood that the same is by way of illustration and example only and is not to be taken by way of limitation. Other integrated circuits may be formed in the substrate, the essence being that the substrate be positively biased so that the conduction path 24 which normally forms may be interrupted. Similarly, insulative layer 18 may be any insulative layer having low moisture resistance which allows the hydroxyl ions to form to cause the corrosion. Although the preferred embodiments used aluminum as the metal for the bonding pad and interconnects, the cathodic corrosion occurs for any amphoteric metal. The spirit and scope of the present invention are to be limited only by the terms of the appended claims.

What is claimed:

1. In an integrated circuit having a substrate at a predetermined positive potential, a first layer of thermally grown insulation over and in contact with said substrate, a second layer of low moisture resistant, chemically vapor deposited insulation including hydrogen ions formed over and in contact with said first layer, aluminum interconnects including at least one aluminum interconnect at a predetermined negative potential over and in contact with said first layer, spaced from the lateral edge of said first layer and separated from the said lateral edge by said second layer, and a current path between said interconnect at said negative potential and said substrate through said second layer, the improvement comprising said first layer extends laterally across the substrate in all directions a distance sufficiently greater than said second layer to prevent said current path between the interconnect at said negative potential and said substrate through said second layer.

2. The integrated circuit of claim 1 wherein said first layer extends at least 0.05 mils per volt of potential difference between said predetermined positive and negative potentials.

3. The integrated circuit of claim 1 wherein said first layer is silicon dioxide and has a resistance of at least $10^9$ ohms.

4. The integrated circuit of claim 1 wherein said second layer is phosphorus doped siloxane.

5. The integrated circuit of claim 1 wherein said circuit includes a complementary pair of insulated gate field effect transistors and said substrate is N conductivity type.

6. In a wafer having a plurality of integrated circuits to be separated at scribe lines, a first layer of thermally grown insulation over and in contact with a substrate, a second layer of chemically vapor-deposited insulation including hydrogen ions formed over and in contact with said first layer, aluminum interconnects over and in contact with said first layer including a first interconnect means in contact with said substrate for applying a predetermined positive potential to said substrate and a second interconnect means for applying a predetermined negative potential to said integrated circuit spaced from the lateral edge of said first layer and separated therefrom by said second layer through which a current path can be defined between said second interconnect means and said substrate, the improvement comprising said first layer is discontinuous at said scribe lines and said second layer being recessed from said edge of said first layer at least 0.05 mils per volt of potential difference between said predetermined positive and negative potentials.

7. In a wafer having a plurality of integrated circuits to be separated at scribe lines, a first layer of thermally grown insulation over and in contact with a substrate, a second layer of low moisture resistant insulation including hydrogen ions formed over and in contact with said first layer, aluminum interconnects over and in contact with said first layer including a first interconnect means in contact with said substrate for applying a predetermined positive potential to said substrate and a second interconnect means for applying a predetermined negative potential to said integrated circuit spaced from the lateral edge of said first layer and separated therefrom by said second layer through which a current path can be defined between said second interconnect means and said substrate, the improvement comprising said first layer is discontinuous at said scribe lines and said second layer being recessed from said edge of said first layer a distance sufficient to prevent said current path between said second aluminum interconnect means and the substrate through said second layer.

8. The wafer of claim 7 wherein said second layer is recessed from the edge of said first layer at least 0.05 mils per volt of potential difference between said predetermined positive and negative potentials.

9. The wafer of claim 7 wherein said first layer of silicon dioxide and has a resistance of at least $10^9$ ohms.

10. The wafer of claim 7 wherein said second layer is phosphorus doped siloxane.

11. The wafer of claim 7 wherein said circuit includes a pair of complementary metal oxide semiconductor transistors and said substrate is N conductivity type.

12. In an integrated circuit having a substrate at a predetermined positive potential, a first layer of thermally grown insulation on said substrate, a second layer of chemically vapor-deposited insulation including hydrogen ions formed over and in contact with said first layer, aluminum interconnects including at least one aluminum interconnect at a predetermined negative potential over and in contact with said first layer, spaced from the lateral edge of said first layer and separated from said lateral edge by said second layer, and a current path between said interconnect at said negative potential and said substrate through said second layer, the improvement comprising the first layer extends laterally across the substrate in all directions a greater distance than said second layer at least 0.05 mils per volt of potential difference between said predetermined positive and negative potentials.

13. The integrated circuit of claim 12 wherein said second layer is phosphorus doped silicon oxide.

* * * * *